(12) United States Patent
Leonhardt

(10) Patent No.: US 7,107,198 B2
(45) Date of Patent: Sep. 12, 2006

(54) AUTOMATIC GENERATION OF REDUCED-SIZE CIRCUIT MODELS INCLUDING INDUCTIVE INTERACTION

(75) Inventor: Goetz Leonhardt, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 745 days.

(21) Appl. No.: 10/001,028

(22) Filed: Nov. 2, 2001

(65) Prior Publication Data

US 2003/0088393 A1 May 8, 2003

(51) Int. Cl.
*G06F 17/50* (2006.01)

(52) U.S. Cl. .............................. 703/13; 703/14; 703/2; 716/1; 716/2

(58) Field of Classification Search .................... 703/2, 703/13, 14; 716/2
See application file for complete search history.

(56) References Cited

U.S. PATENT DOCUMENTS

| | | | | |
|---|---|---|---|---|
| 6,023,573 A * | 2/2000 | Bai et al. | ......................... | 703/2 |
| 6,031,986 A * | 2/2000 | Milsom | ........................ | 703/14 |
| 6,063,130 A * | 5/2000 | Sakamoto | .................... | 703/14 |
| 6,088,523 A * | 7/2000 | Nabors et al. | ................ | 703/14 |
| 6,134,513 A * | 10/2000 | Gopal | ......................... | 703/14 |
| 6,308,304 B1 * | 10/2001 | Devgan et al. | ................ | 716/5 |
| 6,324,493 B1 * | 11/2001 | Belk | ............................. | 703/13 |
| 6,367,053 B1 * | 4/2002 | Belk et al. | ...................... | 716/2 |
| 6,397,171 B1 * | 5/2002 | Belk | ............................ | 703/14 |
| 6,453,444 B1 * | 9/2002 | Shepard | ........................ | 716/2 |
| 6,467,078 B1 * | 10/2002 | Matsuba et al. | ............. | 717/100 |
| 6,662,149 B1 * | 12/2003 | Devgan et al. | ................ | 703/14 |
| 6,870,436 B1 * | 3/2005 | Grebenkemper | ............. | 333/12 |
| 2003/0069722 A1 * | 4/2003 | Beattie et al. | ................. | 703/14 |

OTHER PUBLICATIONS

"Delivering a Full-chip Hierarchical Circuit Simulation & Analysis Solution for naonmeter Designs", S. Wang et al, White Paper, Nassada Corp. Feb. 2001.*
"Interconnect Electromagnetic Modeling using Conduction Modes as Global Basis Functions", L. Danial et al, IEEE 0-7803-6450-3/00, IEEE 2000.*
"Measurement and Modeling of On-chip Transmission Line Effects in a 400 MHz Microprocessor", Restle et al, IEEE Jouranl o Solid-State Circuits, vol. 33, No. 4, Apr. 1998.*
"FastCap: A Multipole Accelerated 3-D Capacitance Extraction Program" IEEE Transactions on Computer-Aided Design, vol. 10, No. 11, Nov. 1991 Authors Keith Nabors and Jacob White, Associate Member, IEEE.
"GMRES: A Generalized Minimal Residual Algorithm for Solving Nonsymmetric Linear Systems" Society for Industrial and Applied Mathematics, vol. 7, No. 3, Jul. 1986 Authors Youcef Saad and Martin H. Schultz.

(Continued)

*Primary Examiner*—Fred Ferris
(74) *Attorney, Agent, or Firm*—Osha Liang LLP

(57) ABSTRACT

A tool for automatically generating a reduced size circuit model including inductive interaction properties is provided. Such inclusion of inductive properties in the reduced size circuit model allows for a more complete and accurate circuit model than those created by conventional methods. Further, a technique for automatically generating a reduced size circuit model including inductive properties that uses less memory space and operates faster than conventional methods is provided.

18 Claims, 5 Drawing Sheets

OTHER PUBLICATIONS

"Heirarchical Interconnect Circuit Models" Michael Beattie, Satrajit Gupta and Lawrence Pileggi Carnegie Mellon University Department of Electrical and Computer Engineering 5000 Forbes Avenue, Pittsburgh, PA 15213.

"PRIMA: Passive Reduced-order Interconnect Macromodeling Algorithm" Altan Odabasioglu, Mustafa Celik, and Lawrence T. Pileggi Department of Electrical and Computer Engineering Carnegie Mellon University, Pittsburgh, PA 15213.

S. Kapur and D. Long, "IES$^3$: A Fast Integral Equation Solver for Efficient 3-Dimensional Extraction", Proceedings of the ICCAD '97 (7 pages).

M. Kamon, J. J. Tsuk and J. K. White, "FASTHENRY: A Multipole-Accelerated 3D Inductance Extraction Program", IEEE Trans MTT-42, Sep. 1994, pp. 1750-1758 (28 pages).

\* cited by examiner

US 7,107,198 B2

AUTOMATIC GENERATION OF REDUCED-SIZE CIRCUIT MODELS INCLUDING INDUCTIVE INTERACTION

BACKGROUND OF THE INVENTION

During chip design, computer simulators such as circuit simulators, field simulators, and hierarchical field simulators are used to model electrical, magnetic, and physical behavior of circuit models. Circuit simulators verify circuit designs and predict general circuit behavior. As shown in FIG. 1, a circuit simulator uses a predefined circuit model (10) (a listing of components, attachments, and known properties of the circuit) to run a circuit simulation (12). The circuit simulation (12) calculates electrical, magnetic, and physical aspects of the circuit design not defined in the circuit model (10), and then produces an output file (14) containing properties given in the circuit model (10) and properties calculated during the circuit simulation (14).

An example of a circuit simulator well known in the art is HSPICE (produced by Avant!). Field simulators and hierarchical field simulators are used primarily to simulate electromagnetic interaction in a circuit (one aspect of circuit behavior). A hierarchical field simulator simulates electromagnetic interaction in hierarchical circuit models (circuit models that have been abstracted into layers). Two examples of hierarchical field simulators are IES3 (produced by Bell Labs) and FastHenry (produced by Massachusetts Institute of Technology).

A circuit printed on an IC is made up of electrical devices such as transistors, i.e., nonlinear elements and wires which connect the electrical devices (known as connecting wires). Wire delay, i.e., the amount of time a signal takes to travel through a connecting wire, is a type of circuit behavior that is approximated with a computer simulator. It is important to know wire delay in a circuit because large amounts of wire delay can adversely affect the operation of the circuit. In order for a computer simulator to approximate wire delay, a connecting wire must be translated into some type of circuit model. In many cases, the connecting wire is translated into a circuit model having resistors and capacitors.

FIGS. 2a and 2b depict the steps of a typical process by which a connecting wire is translated into a resistor and capacitor circuit model. In FIG. 2a, a connecting wire having an "in" node (62) and an "out" node (64) has been split into three conductor segments by inserting two nodes (66, 68) onto the connecting wire. In FIG. 2b, the capacitance and resistance associated with each conductor segment is then modeled by inserting capacitors (72) and resistors (70) into the connecting wire. A capacitor (72) is attached to each node (62, 64, 66, 68) and a resistor (70) is inserted between each pair of nodes (62 and 66, 66 and 68, and 68 and 64). The values of the capacitors (72) and the resistors (70) are ascertained either from a lookup table or from a field simulator, after which, the circuit behavior is modeled using a circuit simulator.

Due to increasing operation frequency within electronic devices, the simple capacitor and resistor circuit model given in FIG. 2b is no longer an accurate model of the wire delay in a connecting wire. For example, the contribution that inductive interaction, i.e., electromagnetic interference, between the conductor segments makes to the wire delay must now be accounted for in the circuit model. Inductive interaction is caused by electromagnetic fields that are produced by current flowing through conductor segments in close proximity with one another. As shown by the circuit model in FIG. 2c, the wire delay caused by inductive interaction between conductor segments is modeled by inserting inductors (74) into the capacitor and resistor circuit model shown in FIG. 2b. An inductor (74) is inserted between each pair of nodes (62 and 66, 66 and 68, and 68 and 64) in series with the resistor (70) located in the same conductor segment. The values of the inductors (74) are ascertained either from a lookup table or from a field simulator.

In addition to the wire delay contributed by inductive interaction between the conductor segments, inductive interaction between the inductors in the conductor segments (known as coupling inductances) contributes wire delay to the circuit model. In a connecting wire represented by "N" conductor segments, there are $N(N-1)/2$ inductive couplings. For example, the connecting wire represented by the circuit model in FIG. 2c has three conductor segments, and, therefore, has $3(3-1)/2$, or three, inductive couplings. The values of these inductive couplings, i.e., the coupling inductances, are calculated using a lookup table or a field simulator, after which, the circuit behavior is modeled using a circuit simulator. In circuit models having a large value for "N," heuristic assumptions, i.e., only large coupling inductances taken into account, are used to eliminate some or all of the inductive couplings from the circuit model. However, simply neglecting some or all of the inductive couplings may lead to an unstable circuit model whose wire delay may no longer correspond to the actual wire delay of the connecting wire being modeled.

Normally, a circuit simulator is not used to calculate coupling inductances because a lookup table or a field simulator takes less time to calculate inductive interaction. However, it is important to note that, although coupling inductances are often calculated using a lookup table or a field simulator, coupling inductances can also be calculated using a circuit simulator. Usually, a lookup table, a field simulator, and a circuit simulator store coupling inductances for a particular circuit model as a square matrix having a row and column dimension of "N." For example, in a circuit model having "N" conductor segments, the coupling inductances ("K") are stored in a square matrix as such:

$$K = \begin{bmatrix} K_{11} & K_{12} & \cdots & K_{1N} \\ K_{21} & \cdots & \cdots & \cdots \\ \cdots & \cdots & \cdots & \cdots \\ K_{N1} & \cdots & \cdots & K_{NN} \end{bmatrix}$$

In a circuit model with a large value for "N," i.e., several conductor segments, the square matrix used to store the coupling inductances requires a large amount of storage space in memory.

In hierarchical field simulators, coupling inductances are represented as the product of two matrices, where one of the matrices represents electrical effects that contribute to inductance and the other matrix represents magnetic effects that contribute to inductance. The matrix representing the electrical effects, an "electrical matrix," shows the voltage present in the conductor segments. The matrix representing the magnetic effects, a "magnetic matrix," shows the current present in the conductor segments. The longer dimension (row or column) in the electrical matrix and the magnetic matrix indicates the conductor segments in each of the two matrices. If the longer dimension is a row, then each row in the matrix represents a conductor segment, however, if the longer dimension is a column, then each column in the matrix represents a conductor segment.

If "K" is used to represent a matrix of coupling inductances, and "A" and "B" are used to represent an electrical matrix and a magnetic matrix, then:

$$K = A*B, \text{ where}$$

$$A = \begin{bmatrix} A_{11} & \cdots & A_{1P} \\ \cdots & \cdots & \cdots \\ \cdots & \cdots & \cdots \\ A_{NI} & \cdots & A_{NP} \end{bmatrix}, B = \begin{bmatrix} B_{11} & \cdots & B_{1P} \\ \cdots & \cdots & \cdots \\ \cdots & \cdots & \cdots \\ B_{NI} & \cdots & B_{NP} \end{bmatrix},$$

and P<<N and also several entries in A,B=0.

Because the total number of elements in "A" and "B" is less than the total number of elements that would be present in "K," the amount of time/memory space required to compute/store "A" and "B" is much smaller than the time/memory space required to compute/store "K." Thus, a hierarchical simulator uses less time/memory space to calculate coupling inductances than a lookup table, a field simulator, or a circuit simulator because a hierarchical simulator represents coupling inductances as matrices "A" and "B," while the lookup table, the field simulator, and the circuit simulator represent coupling inductances as a matrix "K." This implies that there is an advantage in using a hierarchical simulator to calculate coupling inductances over using a lookup table, a field simulator, or a circuit simulator.

Because a circuit simulator is typically used during chip design (where a hierarchical field simulator may not be used), it would be advantageous to be able to calculate coupling inductances for connecting wires using a hierarchical field simulator, and then include these values in the circuit model used by the circuit simulator. Unfortunately, the hierarchical algorithm for calculating coupling inductances is hidden inside the hierarchical simulator. This means that the electrical and magnetic matrices cannot be accessed by a circuit simulator. As a result, there is a need for a hierarchical algorithm capable of inclusion in a circuit simulator. This will allow a chip designer to take advantage of the speed and storage capabilities of a hierarchical simulator, while retaining the flexibility of a circuit simulator.

SUMMARY OF INVENTION

According to one aspect of the present invention, a method for automatic generation of a reduced size circuit model having inductive interaction properties comprises generating a first set of data using an inductive interaction algorithm, generating a second set of data using the inductive interaction algorithm, translating the first set of data to at least one current controlled auxiliary circuit, translating the second set of data to at least one voltage controlled auxiliary circuit, and generating the reduced size circuit model by operatively connecting the current controlled auxiliary and voltage controlled auxiliary circuits to an original circuit model.

According to another aspect, a computer system comprises an integrated circuit, a memory, and instructions residing in the memory executable in the integrated circuit for generating a first set of data using an inductive interaction algorithm, generating a second set of data using the inductive interaction algorithm, translating the first set of data to at least one current controlled auxiliary circuit, translating the second set of data to at least one voltage controlled auxiliary circuit, and generating a reduced size circuit model by operatively connecting the current controlled auxiliary and voltage controlled auxiliary circuits to an original circuit model.

According to another aspect, a computer-readable medium having recorded therein instructions executable by processing, the instruction for generating a first set of data using an inductive interaction algorithm, generating a second set of data using the inductive interaction algorithm, translating the first set of data to at least one current controlled auxiliary circuit, translating the second set of data to at least one voltage controlled auxiliary circuit, and generating a reduced size circuit model by operatively connecting the current controlled auxiliary and voltage controlled auxiliary circuits to an original circuit model.

Other aspects and advantages of the invention will be apparent from the following description and the appended claims.

DETAILED DESCRIPTION

Embodiments of the present invention relate to a method for automatically generating a reduced-size circuit model including inductive interaction. Embodiments of the present invention further relate to an apparatus that automatically generates a reduced-size circuit model including inductive interaction. Embodiments of the present invention further relate to a method of reducing the amount of time a circuit simulator requires to produce a circuit simulation by calculating a circuit design's inductive interaction prior to circuit simulation. Embodiments of the present invention further relate to a method of automatically generating a reduced-size circuit model including a circuit design's inductive interaction by incorporating into a circuit simulator an algorithm used by a hierarchical field simulator to calculate inductive interaction.

Figure 1:
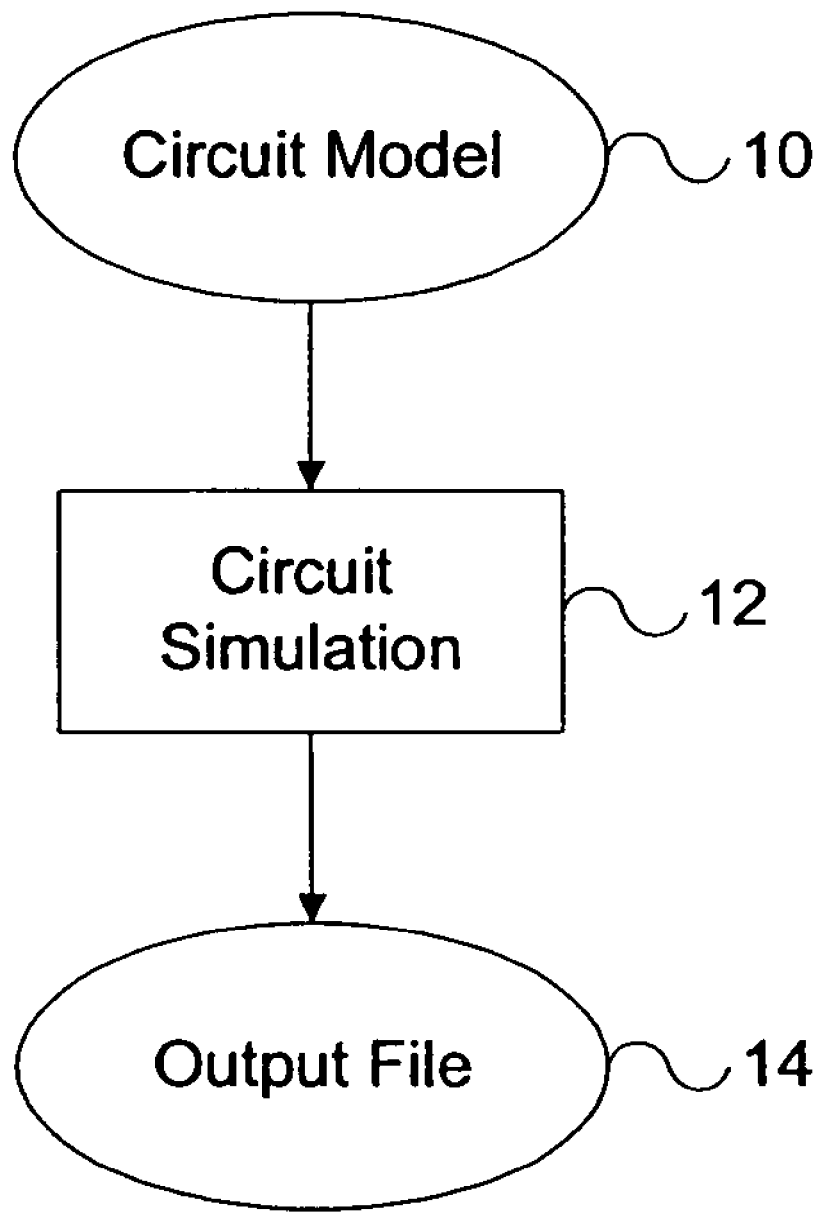
FIG. 1 shows the data flow in a typical circuit simulator.
Figure 2A:
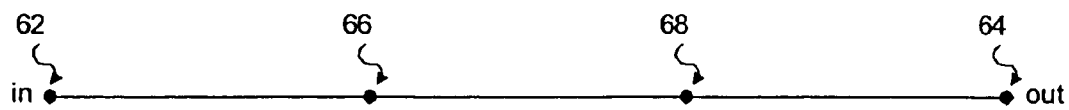
FIG. 2a shows a connecting wire before a typical translation process.
Figure 2B:
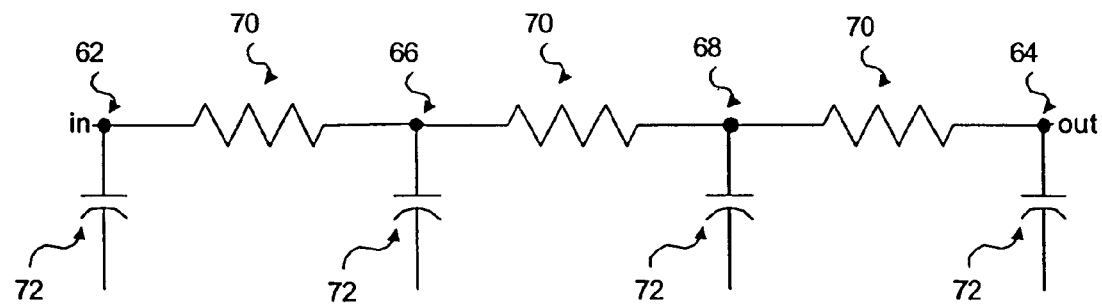
FIG. 2b shows a connecting wire after a typical translation process.
Figure 2C:
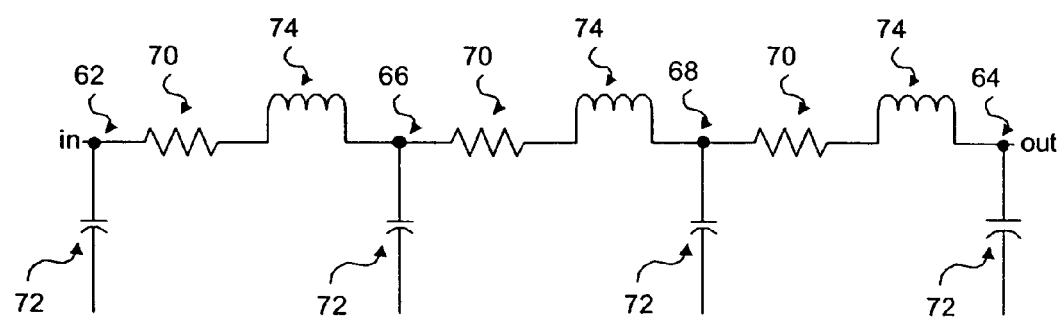
FIG. 2c shows a connecting wire after a typical translation process.
Figure 3A:
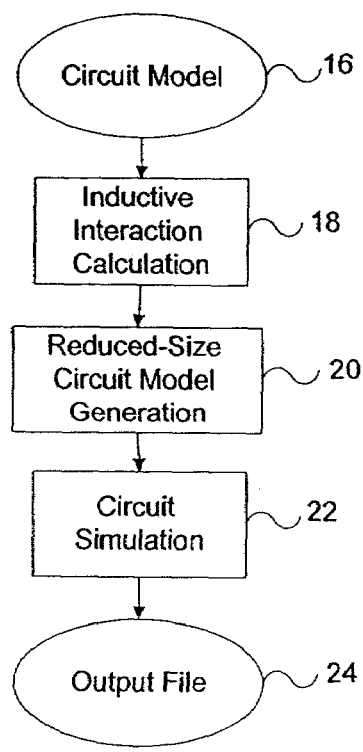
FIG. 3a shows data flow in a circuit simulator in accordance with an embodiment of the present invention.

FIG. 3a shows an exemplary circuit simulation process performed by a circuit simulator in accordance with an embodiment of the present invention. In an inductive interaction calculation phase (step 18), a circuit model (16), representing a circuit design, is used to calculate the circuit design's inductive interaction. The inductive interaction calculation (step 18) is implemented using algorithm such as one used by a hierarchical field simulator to calculate inductive interaction (a hierarchical algorithm). In an embodiment of the present invention, the hierarchical algorithm has been incorporated into the circuit simulator. By using a hierarchical algorithm to calculate inductive interaction, a circuit simulator uses less space/time to store/calculate inductive couplings. This is due to the fact that the hierarchical algorithm stores inductive couplings as rectangular electrical and magnetic matrices, rather than a square inductive matrix.

Referring again to FIG. 3a, during a reduced-size circuit model generation phase (step 20), the circuit simulator creates a reduced-size circuit model including a set of circuits representing inductive couplings stored in the electrical and magnetic matrices. A circuit simulation (step 22) uses the reduced-size circuit model to calculate electrical, magnetic, and physical aspects of the circuit design not defined in the reduced-size circuit model, and then produces an output file (step 24) containing properties given in the reduced-size circuit model and properties calculated during the circuit simulation (step 22).

Figure 3B:
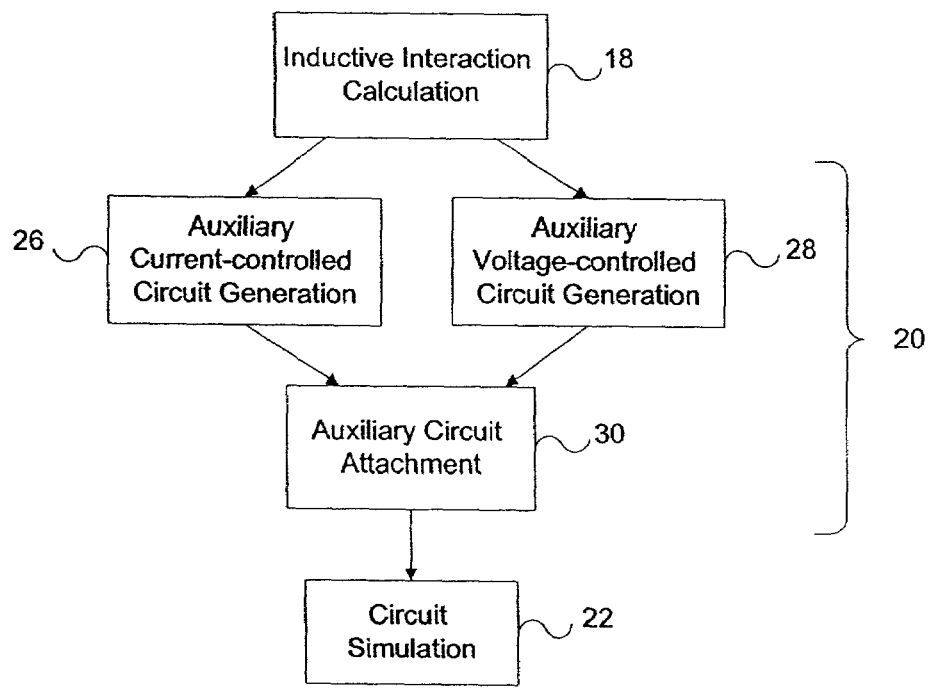
FIG. 3b shows data flow of a reduced-size circuit model generation phase in accordance with an embodiment of the present invention.

FIG. 3b shows an exemplary process flow of the reduced-size circuit model generation phase (step 20) in accordance with the embodiment shown in FIG. 3a. Before the inductive couplings stored in the electrical and magnetic matrices can be inserted into the reduced-size circuit model, they are translated into a form that the circuit simulator can interpret during circuit simulation (step 22). As a result, auxiliary circuits representing the coupling inductances are created. Because the storage space for coupling inductances has been reduced, the number of auxiliary circuits used during circuit simulation (step 22) is reduced in size. The aforementioned auxiliary circuits are created during a current-controlled auxiliary circuit generation phase (step 26) and a voltage-controlled auxiliary circuit generation phase (step 28). These auxiliary circuits are inserted into the circuit model of FIG. 3a (16) during an auxiliary circuit attachment phase (step 30) given in FIG. 3b.

Figure 4A:
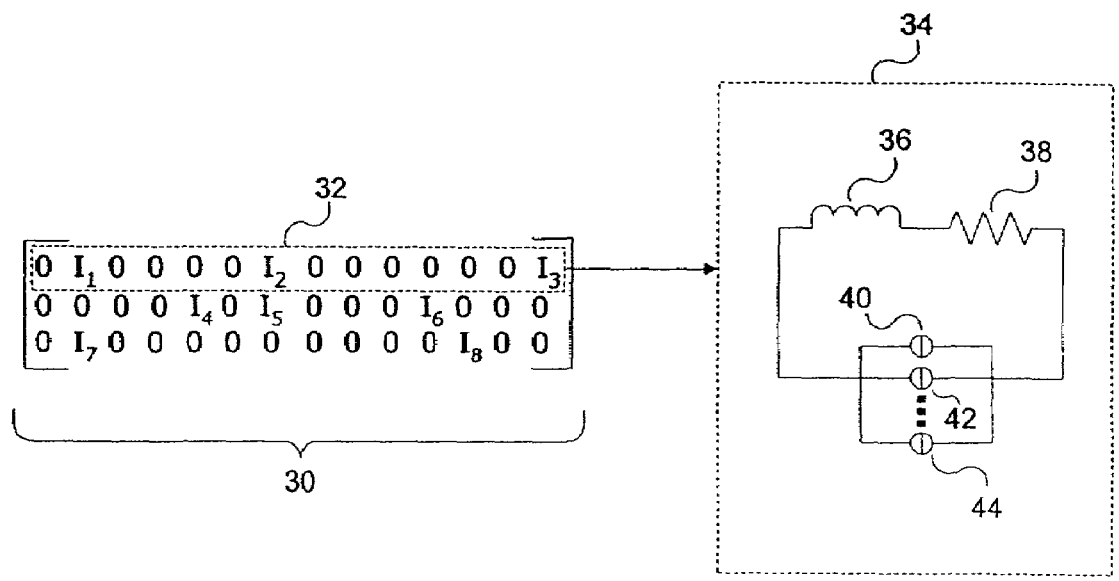
FIG. 4a shows the formation of a current-controlled auxiliary circuit in accordance with an embodiment of the present invention.

In the current-controlled auxiliary circuit generation phase (step 26), the magnetic effects calculated in the inductive interaction calculation phase (step 18) are used to generate current-controlled auxiliary circuits. Referring now to FIG. 4a, for each conductor segment (32) in a magnetic matrix (30), an auxiliary current-controlled circuit (34) is created. Each auxiliary current-controlled circuit (34) is powered by a set of current-controlled current sources ("CCCSs") (40, 42, 44), which represent the non-zero current entries ($I_1$, $I_2$, $I_3$) in the conductor segment (32). The CCCSs (40, 42, 44) are coupled to the auxiliary current-controlled circuit (34) in a parallel configuration. Each auxiliary current-controlled circuit (34) also includes an inductor (36) and a resistor (38) in order to satisfy the simulation boundary conditions imposed by the circuit simulator. The respective inductance and resistance measurements of the inductor (36) and the resistor (38) are such that the current through the inductor (36) is the sum of the generated currents from the CCCSs (40, 42, 44) of the current-controlled circuit (34).

Figure 4B:
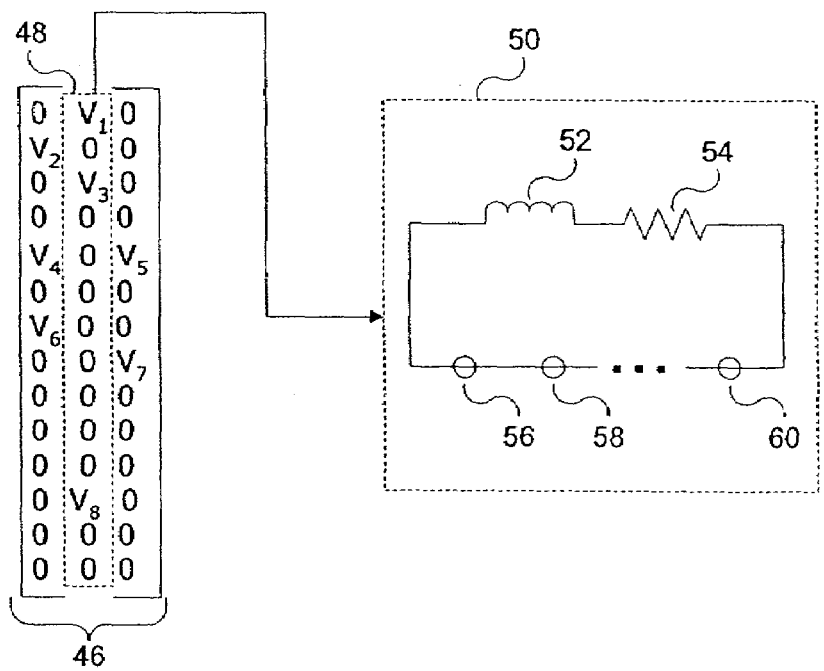
FIG. 4b shows the formation of a voltage-controlled auxiliary circuit in accordance with an embodiment of the present invention.

In the voltage-controlled auxiliary circuit generation phase (28 in FIG. 3), the electrical effects calculated in the inductive interaction calculation phase (step 18) are used to generate voltage-controlled auxiliary circuits. Referring now to FIG. 4b, for each conductor segment (48) in an electrical matrix (46), an auxiliary voltage-controlled circuit (50) is created. Each auxiliary voltage-controlled circuit (50) is powered by a set of voltage-controlled voltage sources ("VCVSs") (56, 58, 60), which represent the non-zero voltage entries ($V_1$, $V_3$, $V_8$) in the conductor segment (48). The VCVSs (56, 58, 60) are attached to the auxiliary voltage-controlled circuit (50) in a series configuration. Again, each auxiliary voltage-controlled circuit (50) includes an inductor (52) and a resistor (54) in order to satisfy the simulation boundary conditions imposed by the circuit simulator. The respective inductance and resistance measurements of the inductor (52) and the resistor (54) are such that the voltage through the inductor (52) is the sum of the generated voltage from the VCVSs (56, 58, 60) and the voltage drop across the auxiliary voltage-controlled circuit (50) itself.

Referring again to FIG. 3b, the current-controlled auxiliary circuits (34) and the voltage-controlled auxiliary circuits are inserted into the reduced-size circuit model during the auxiliary circuit attachment phase (step 30). Once the auxiliary circuits have been attached to the reduced-size circuit model, the reduced-size circuit model is used in a circuit simulation (step 22) to model circuit behavior.

Advantages of the present invention may include one or more of the following. In some embodiments, because an inductive interaction calculation is incorporated into a circuit simulator to calculate a circuit design's inductive interaction, the circuit simulator requires less time to produce a circuit simulation.

In some embodiments, because auxiliary circuits representing effects of inductive interaction are incorporated into an original circuit model, inductive interaction may be included in a circuit simulation process without altering the design of the circuit simulation process.

In some embodiments, because an inductive interaction calculation is performed outside of a circuit simulation phase, numerical integration based software tools (like HSPICE produced by Avant!) used for a circuit simulation purpose obtain additional stability, effectively increasing the software tool's ability to produce data for a wide range of circuit configurations, inclusive of those that failed for an original circuit design.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for automatic generation of a reduced size circuit model having inductive interaction properties, comprising:

generating a sparse magnetic matrix comprising a first set of data using an inductive interaction algorithm, wherein each nonzero element in the first set of data represents a current entry of a conductor segment of a circuit;

generating a sparse electrical matrix comprising a second set of data using the inductive interaction algorithm, wherein each nonzero element in the second set of data represents at least one voltage entry of the conductor segment of the circuit;

translating the first set of data to at least one current controlled auxiliary circuit representing coupling inductances in the conductor segment;

translating the second set of data to at least one voltage controlled auxiliary circuit representing coupling inductances in the conductor segment; and generating the reduced size circuit model by operatively connecting the current controlled auxiliary and voltage controlled auxiliary circuits to an original circuit model of the circuit, wherein data sets comprise groups.

2. The method of claim 1, further comprising:
simulating the reduced size circuit model to attain circuit properties, wherein the circuit properties comprise inductive properties.

3. The method of claim 1, wherein the sparse magnetic matrix further comprises a third set of data, wherein each nonzero element in the third set of data represents a current entry of a second conductor segment of the circuit.

4. The method of claim 3, wherein a group of data within the magnetic matrix is translated into a current source in parallel with another current source created from a translation of another group of data within the magnetic matrix.

5. The method of claim 1, wherein the sparse electrical matrix further comprises a fourth set of data, wherein each nonzero element in the fourth set of data represents at least one voltage entry of the second conductor segment.

6. The method of claim 5, wherein a group of data within the electrical matrix is translated into a voltage source in series with another voltage source created from a translation of another group of data within the electrical matrix.

7. A computer system, comprising:
an integrated circuit;
a memory; and
instructions residing in the memory executable in the integrated circuit for
generating a sparse magnetic matrix comprising a first set of data using an inductive interaction algorithm, wherein each nonzero element in the first set of data represents a current entry of a conductor segment of a circuit;
generating a sparse electrical matrix comprising a second set of data using the inductive interaction algorithm. wherein each nonzero element in the second set of data represents at least one voltage entry of the conductor segment of the circuit;
translating the first set of data to at least one current controlled auxiliary circuit representing coupling inductances in the conductor segment;
translating the second set of data to at least one voltage controlled auxiliary circuit representing coupling inductances in the conductor segment; and
generating a reduced size circuit model by operatively connecting the current controlled auxiliary and voltage controlled auxiliary circuits to an original circuit model of the circuit, wherein data sets comprise groups.

8. The computer system of claim 7, further comprising:
instructions for simulating the reduced size circuit model to attain circuit properties, wherein the circuit properties comprise inductive properties.

9. The computer system of claim 7, wherein the sparse magnetic matrix further comprises a third set of data, wherein each nonzero element in the third set of data represents a current entry of a second conductor segment of the circuit.

10. The computer system of claim 9, wherein a group of data within the magnetic matrix is translated into a current source in parallel with another current source created from a translation of another group of data within the magnetic matrix.

11. The computer system of claim 7, wherein the sparse electrical matrix further comprises a fourth set of data, wherein each nonzero element in the fourth set of data represents at least one voltage entry of the second conductor segment.

12. The computer system of claim 11, wherein a group of data within the electrical matrix is translated into a voltage source in series with another voltage source created from a translation of another group of data within the electrical matrix.

13. A computer-readable medium having recorded therein instructions executable by processing, the instruction for:
generating a sparse magnetic matrix comprising a first set of data using an inductive interaction algorithm, wherein each nonzero element in the first set of data represents at current entry of a conductor segment of a circuit;
generating a sparse electrical matrix comprising a second set of data using the inductive interaction algorithm, wherein each nonzero element in the second set of data represents at least one voltage entry of the conductor segment of the circuit;
translating the first set of data to at least one current controlled auxiliary circuit representing coupling inductances in the conductor segment;
translating the second set of data to at least one voltage controlled auxiliary circuit representing coupling inductances in the conductor segment; and
generating a reduced size circuit model by operatively connecting the current controlled auxiliary and voltage controlled auxiliary circuits to an original circuit model of the circuit, wherein data sets comprise groups.

14. The computer-readable medium of claim 13, further comprising:
simulating the reduced size circuit model to attain circuit properties, wherein the circuit properties comprise inductive properties.

15. The computer-readable medium of claim 13, wherein the sparse magnetic matrix further comprises a third of data, wherein each nonzero element in the third set of data represents a current entry of a second conductor segment of the circuit.

16. The computer-readable medium of claim 15, wherein a group of data within the magnetic matrix is translated into a current source in parallel with another current source created from a translation of another group of data within the magnetic matrix.

17. The computer-readable medium of claim 13, wherein the sparse electrical matrix further comprises a fourth set of data, wherein each nonzero element in the fourth set of data represents at least one voltage entry of the second conductor segment.

18. The computer-readable medium of claim 17, wherein a group of data within the electrical matrix is translated into a voltage source in series with another voltage source created from a translation of another group of data within the electrical matrix.

* * * * *